United States Patent
Andreev et al.

(10) Patent No.: US 7,305,597 B1
(45) Date of Patent: Dec. 4, 2007

(54) SYSTEM AND METHOD FOR EFFICIENTLY TESTING A LARGE RANDOM ACCESS MEMORY SPACE

(75) Inventors: Alexander E. Andreev, San Jose, CA (US); Ranko Scepanovic, Saratoga, CA (US)

(73) Assignee: LSI Corporation, Milpitas, CA (US)

( * ) Notice: Subject to any disclaimer, the term of this patent is extended or adjusted under 35 U.S.C. 154(b) by 246 days.

(21) Appl. No.: 10/646,535

(22) Filed: Aug. 22, 2003

(51) Int. Cl.
*G11C 29/26* (2006.01)
*G11C 29/40* (2006.01)

(52) U.S. Cl. .................... 714/719; 714/718; 714/733

(58) Field of Classification Search ............... 714/719, 714/718, 25, 42, 54, 702, 732, 733; 365/200, 365/201
See application file for complete search history.

(56) References Cited
U.S. PATENT DOCUMENTS 4,433,413 A * 2/1984 Fasang ....................... 714/732
5,553,082 A * 9/1996 Connor et al. ............... 714/733
5,612,916 A * 3/1997 Neduva ................. 365/189.04
5,825,782 A * 10/1998 Roohparvar ................ 714/718

* cited by examiner

*Primary Examiner*—Cynthia Britt
*Assistant Examiner*—Dipakkumar Gandhi
(74) *Attorney, Agent, or Firm*—Hitt Gaines PC

(57) ABSTRACT

A system for, and method of, allowing conventional memory test circuitry to test parallel memory arrays and an integrated circuit incorporating the system or the method. In one embodiment, the system includes: (1) bit pattern distribution circuitry that causes a probe bit pattern generated by the memory test circuitry to be written to each of the memory arrays, (2) a pseudo-memory, coupled to the bit pattern distribution circuitry, that receives a portion of the probe bit pattern and (3) combinatorial logic, coupled to the pseudo-memory, that employs the portion and data-out bit patterns read from the memory arrays to generate a response bit pattern that matches the probe bit pattern only if all of the data-out bit patterns match the probe bit pattern.

20 Claims, 3 Drawing Sheets

SYSTEM AND METHOD FOR EFFICIENTLY TESTING A LARGE RANDOM ACCESS MEMORY SPACE

TECHNICAL FIELD OF THE INVENTION

The present invention is directed, in general, to memory testing and, more specifically, to a system and method, particularly appropriate for built-in self test, for efficiently testing a large random access memory (RAM) space.

BACKGROUND OF THE INVENTION

RAM is an essential component of digital computers, often responsible for storing both software instructions and the data on which those instructions act. If a malfunction in RAM goes undetected, the computer risks generating corrupted data or ceasing operation altogether. Therefore, ensuring the proper functioning of RAM is a vital prerequisite to performing work with a computer.

A common way to test RAM is to write a known bit pattern to addresses in the RAM, then read bit patterns from the same addresses and compare the bit pattern written with the bit pattern read. Any discrepancy indicates a malfunction. A more thorough way to test RAM is to repeat the above using different bit patterns. The bit patterns are best chosen to force, over the course of the test, every bit of each addressable location to both possible logical states: zero and one.

Built-in self test (BIST) has become a favored mechanism for carrying out RAM tests. BIST calls for RAM test circuitry to be integrated into the same chip or module with the RAM such that the two are treated architecturally as a single unit and further that RAM testing begins automatically when the RAM is initialized. BIST frees computer system designers from having to concern themselves with designing their own external RAM test circuitry for the RAM they want to include.

Over the years, RAM has become quite inexpensive compared with other computer components. Accordingly, the amount of RAM used in computer systems has skyrocketed. Large RAM spaces can greatly enhance computer performance and capability, but they suffer a distinct disadvantage in one important respect. Since thorough RAM testing involves testing each address, the time required to test is a function of the number of addresses contained in the RAM. Thus, large RAM spaces take a long time to test. As RAM requirements continue to grow, the problem will only become worse in the future.

What is needed in the art is a more efficient way to test large RAM spaces thoroughly. What is further needed in the art is a way to achieve BIST with respect to a large RAM space.

SUMMARY OF THE INVENTION

It has been realized that most large RAM spaces in today's computer systems are created by gathering smaller, identical RAM arrays together into a cooperating group. The present invention introduces a system and method for testing large RAM spaces that comes into play when the RAM arrays are identical to one another. According to the principles of the present invention, multiple identical memory arrays are tested in parallel (concurrently). This significantly increases overall test speed without any modification to the conventional memory testing (e.g., BIST) circuitry and without compromising testing thoroughness.

When the memory test circuitry in question is BIST circuitry, the fact that no modification is made to the circuitry becomes especially important. Modification takes time and money and requires multiple BIST IC layouts to be generated. With the present invention, a single BIST circuitry layout can be employed in multiple ICs to test a broad spectrum of memory configurations efficiently.

More specifically, in one aspect, the present invention provides a system for allowing conventional memory test circuitry to test parallel memory arrays. The system includes: (1) bit pattern distribution circuitry that causes a probe bit pattern generated by the memory test circuitry to be written to each of the memory arrays, (2) a pseudo-memory, coupled to the bit pattern distribution circuitry, that receives a portion of the probe bit pattern and (3) combinatorial logic, coupled to the pseudo-memory, that employs the portion and data-out bit patterns read from the memory arrays to generate a response bit pattern that matches the probe bit pattern only if all of the data-out bit patterns match the probe bit pattern.

In another aspect, the present invention provides a method for allowing conventional memory test circuitry to test parallel memory arrays. The method includes: (1) causing a probe bit pattern generated by the memory test circuitry to be written to each of the memory arrays, (2) receiving a portion of the probe bit pattern into a pseudo-memory, and (3) employing the portion and data-out bit patterns read from the memory arrays to generate a response bit pattern that matches the probe bit pattern only if all of the data-out bit patterns match the probe bit pattern.

In yet another aspect, the present invention provides an integrated circuit (IC). The IC includes: (1) a processor, (2) a plurality of identical memory arrays under control of the processor, (3) conventional built-in test (BIST) circuitry, (4) multiplexers, associated with the plurality of identical memory arrays and coupled to the processor and the conventional BIST circuitry, that allows the conventional BIST circuitry to take the control from the processor and (5) a system that allows the conventional BIST circuitry to test the plurality of identical memory arrays in parallel. The system is substantially as set forth above. "Identical," for purposes of the present invention, means having the same amount of addressable space in terms of length (addressable locations) and width (bits). 4K arrays are "identical" even if they have a different physical layout, have different control circuitry, contain different types of transistors or are of different speed or operating theory. 4K arrays are not, however, "identical" to 16K arrays.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
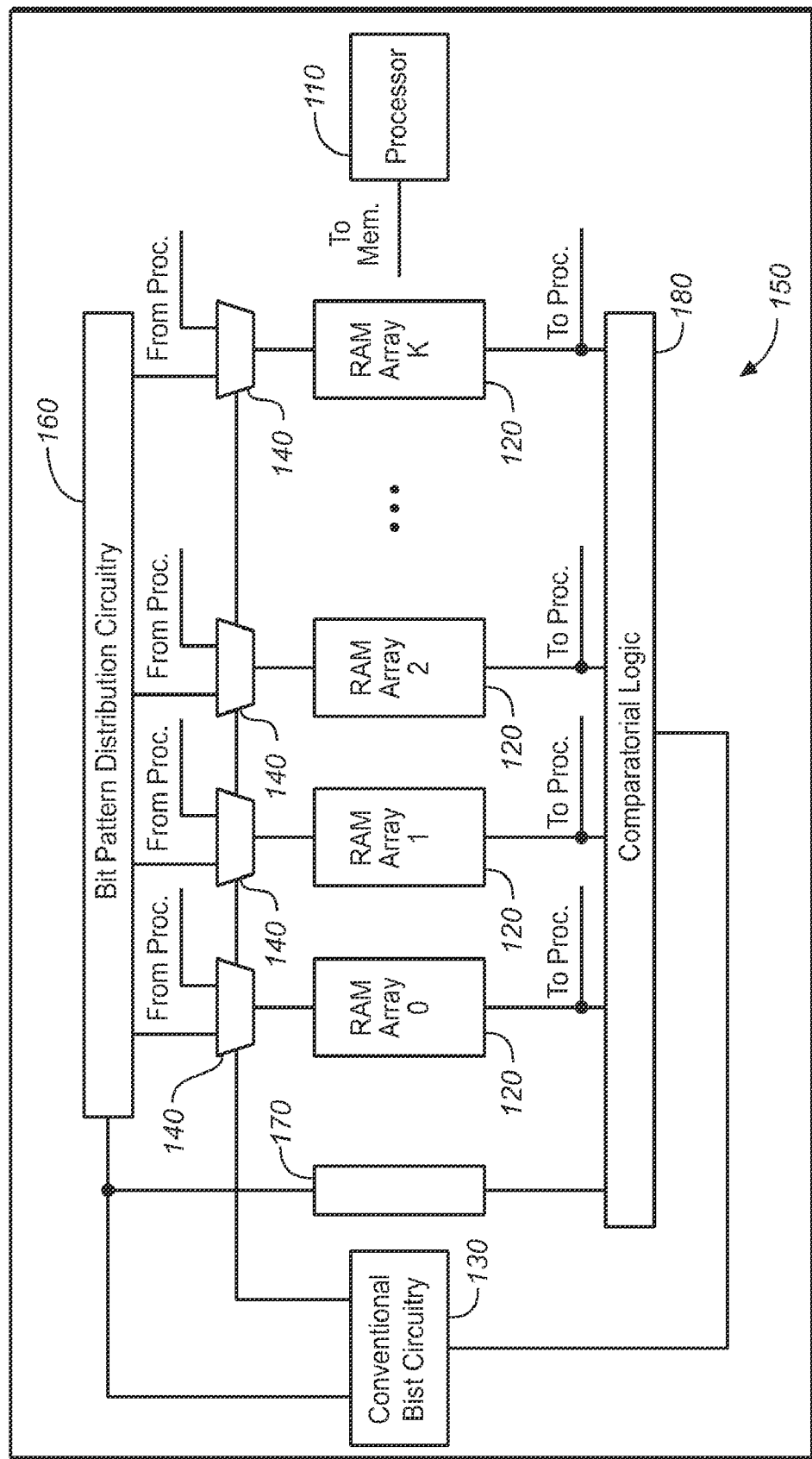
FIG. 1 illustrates a highly schematic block diagram of an IC incorporating a system for allowing conventional memory test circuitry to test parallel memory arrays constructed according to the principles of the present invention.

Referring initially to FIG. 1, illustrated is a highly schematic block diagram of an IC, generally designated 100, that incorporates a system for allowing conventional memory test (e.g., BIST) circuitry to test parallel memory (e.g., RAM) arrays constructed according to the principles of the present invention. An IC 100 is advantageously embodied in or on a single substrate, often composed of silicon.

The IC 100 has a processor 110. The processor 110 may be of any kind, including a microprocessor, microcontroller or digital signal processor (DSP). The processor 110 is depicted in FIG. 1 merely as a generic user of memory. The processor's particular configuration and capabilities are inconsequential to the operation of the present invention.

The IC 100 further includes a plurality of identical RAM arrays 120. While the processor 110 is operating, the plurality of identical RAM arrays 120 are under control of the processor 110. (Because the processor's use of the plurality of identical RAM arrays 120 is peripheral to the focus of this discussion, the various connections between the processor 110 and the plurality of identical RAM arrays 120 is not completely shown.)

The processor 110 employs the plurality of identical RAM arrays 120 as a memory space for storing software instructions or data upon which the processor 110 can operate. Most typically, address offsets are employed to concatenate the addressable spaces of the plurality of identical RAM arrays 120 to yield a single, large memory space. However, those skilled in the pertinent art understand how RAM arrays can be grouped in various ways to form various memory spaces to support a functional computer system.

The IC 100 further includes conventional BIST circuitry 130. Being conventional, the BIST circuitry 130 is designed to test a single memory space. The conventional BIST circuitry 130 tests the memory space by writing probe bit patterns to addressable locations in the memory space and then reading response bit patterns (in the form of data-out bit patterns) from those addressable locations. To be thorough, the conventional BIST circuitry 130 may provide different patterns to each of the addressable locations. If the response bit patterns match the probe bit patterns, the memory space passes its test. If not, the memory space is deemed to be malfunctioning.

Irrespective of the nature of the bit patterns or the order in which the conventional BIST circuitry 130 writes or reads the bit patterns to or from the memory space, the conventional BIST circuitry 130 expects to read the same bit patterns it previously wrote. The system and method of the present invention respect this expectation, thereby allowing the single-memory-space-testing conventional BIST circuitry 130 to test multiple identical memory spaces concurrently without modification.

The IC 100 includes multiplexers 140. The multiplexers 140 are associated with the plurality of identical RAM arrays 120. The multiplexers 140 are also coupled to the processor 110 and the conventional BIST circuitry 130. In a manner to be described more completely below, the multiplexers 140 allow the conventional BIST circuitry 130 to take control of the plurality of identical RAM arrays 120 from the processor 110 so the conventional BIST circuitry 130 can test what appears to be a single memory space.

The illustrated embodiment of the system of the present invention, generally designated 150, allows the conventional BIST circuitry 130 to test the plurality of identical RAM arrays 120 in parallel, so that the plurality of identical RAM arrays 120 appear to be a single, smaller memory space. For simplicity's sake, the system 150 will only be described generally in conjunction with FIG. 1.

The system 150 includes bit pattern distribution circuitry 160. The bit pattern distribution circuitry 160 causes a probe bit pattern (not shown) generated by the conventional BIST circuitry 130 to be written to each of the plurality of RAM arrays 120. The system 150 further includes a pseudo-memory 170. The pseudo-memory 170 is coupled to the probe bit pattern distribution circuitry 160. The pseudo-memory 170 receives a portion of the probe bit pattern. The system 150 still further includes combinatorial logic 180. The combinatorial logic 180 is coupled to the pseudo-memory 170. The combinatorial logic 180 employs the portion stored in the pseudo-memory 170 and data-out bit patterns (not shown) read from the plurality of RAM arrays 120 to generate a response bit pattern (not shown) that matches the probe bit pattern only if all of the data-out bit patterns match the probe bit pattern.

Figure 2:
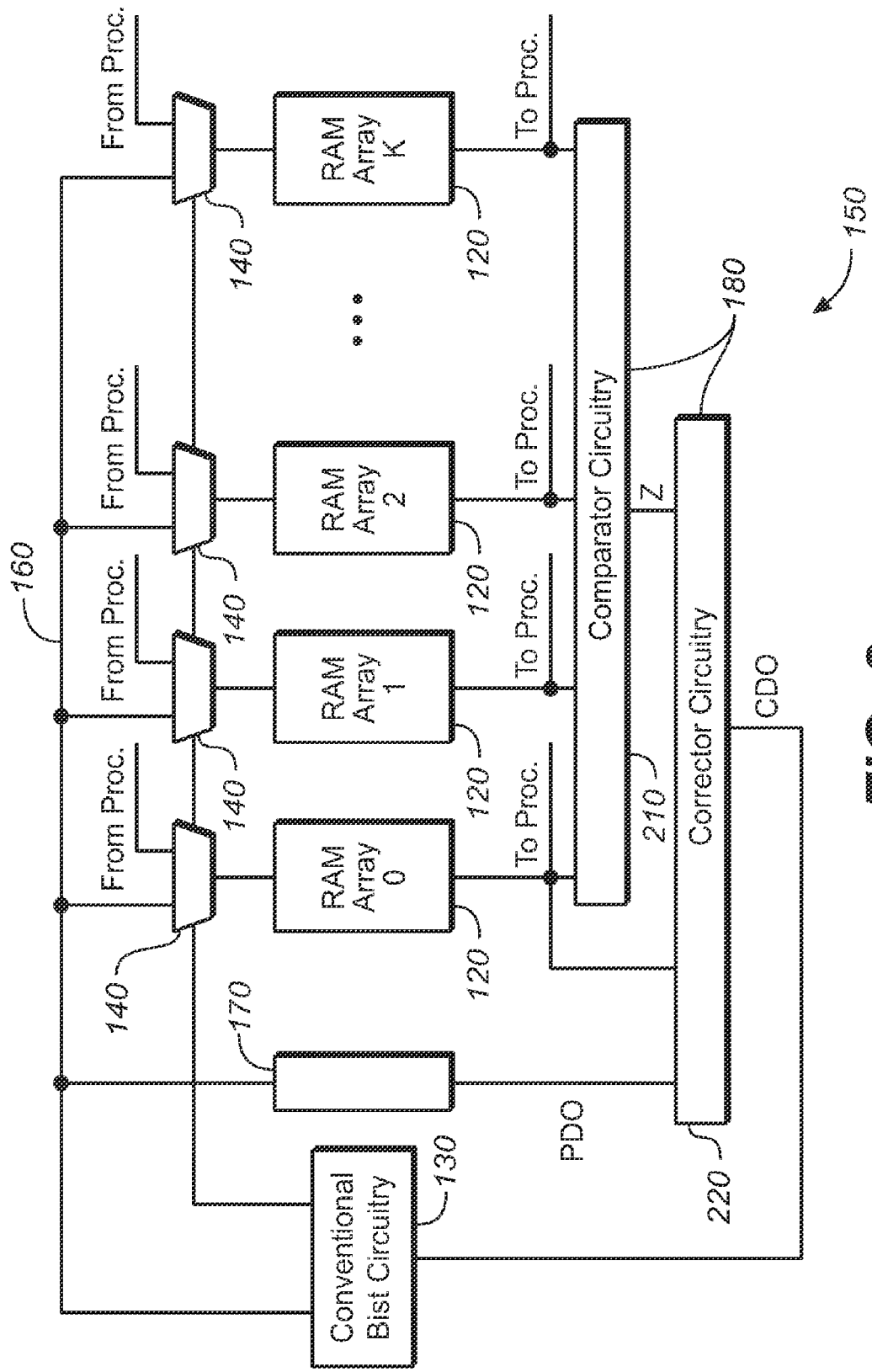
FIG. 2 illustrates a block diagram of one embodiment of a system for allowing conventional memory test circuitry to test parallel memory arrays constructed according to the principles of the present invention.

Having generally described an IC 100 having novel BIST capability, the system 150 that lends the IC 100 that capability will now be described more particularly. Turning now to FIG. 2, illustrated is a more detailed block diagram of one embodiment of the system 150.

BIST is initiated when the conventional BIST circuitry 130 asserts a test signal. The test signal is distributed to each of the multiplexers 140, causing the multiplexers 140 to select signals emanating from the bit pattern distribution circuitry 160 in lieu of the processor 110.

As stated above, the bit pattern distribution circuitry 160 causes a probe bit pattern generated by the conventional BIST circuitry 130 to be written to each of the plurality of RAM arrays 120. Thus, were the conventional BIST circuitry 130 to generate a 16-bit probe bit pattern of "0101010101010101" and indicate that the pattern should be written to a particular addressable location of the memory space, the bit pattern distribution circuitry 160 would cause "0101010101010101" to be written to that particular addressable location of each of the plurality of RAM arrays 120.

In FIG. 2, the bit pattern distribution circuitry 160 takes the form of a data bus extending from the conventional BIST circuitry to each of the multiplexers 140. The data bus provides a simple means for distributing the various probe bit patterns the conventional BIST circuitry 130 generates to each of the plurality of RAM arrays 120 when the multiplexers 140 are configured to select signals emanating from the bit pattern distribution circuitry 160. Of course, circuitry more complex than a data bus could be used to embody the bit pattern distribution circuitry 160.

As stated above, the pseudo-memory 170 receives a portion of each probe bit pattern written to the plurality of RAM arrays 120. In the illustrated embodiment, the pseudo-memory 170 is only one bit wide, and receives the first, or most significant, bit of the probe bit pattern. The contents of the pseudo-memory 170 are assumed to be correct, i.e., bits read from the pseudo-memory 170 are assumed to be the same bits previously written to the pseudo-memory 170. The purpose of the pseudo-memory 170 will become apparent.

As stated above, the combinatorial logic 180 employs the portion stored in the pseudo-memory 170 and corresponding data-out bit patterns read from the plurality of RAM arrays 120 to generate a response bit pattern that matches the probe bit pattern only if all of the data-out bit patterns match the probe bit pattern.

The illustrated embodiment of the combinatorial logic 180 is divided into two pieces: comparator circuitry 210 and corrector circuitry 220. The comparator circuitry 210 produces a "zero bit" only if all of the data-out bit patterns corresponding to a particular addressable location match the probe bit pattern previously written to that address. To do so, the illustrated embodiment of the comparator circuitry 210 performs the following function Y[ ]:

$$Y[i*(k-1)+j] = DO_j[i] \vee DO_{j+1}[i],$$

where:
DO$_j$ is a data-out bit pattern from RAM array j,
i=0, 1, . . . , m−1,
j=0, 1, . . . , k−2,
k is the number of RAM arrays, and
m is the bit-width of the RAM arrays.

Y[ ] contains only zeroes if all of the data-out bit patterns read from a particular addressable location of the plurality of RAM arrays 120 agree with each other. Otherwise, Y[ ] contains one or more ones. Each one indicates a disagreement and thus an error among the plurality of RAM arrays 120. (Implicit in the choice of Y[ ] as an acceptable function is the assumption that the probability of all RAM arrays containing the same, but erroneous, pattern at a particular addressable location is vanishingly low.)

The information contained in Y[ ] is then compiled into a single bit, the so-called "zero bit." Accordingly, the illustrated embodiment of the comparator circuitry 210 also performs the following function:

$$z = \bigvee_{t=0}^{(k-1)*m} Y[t]$$

The value of the zero bit Z is zero only if Y[ ] contains all zeroes (no disagreements evident in the plurality of RAM arrays 120); otherwise the value of the zero bit Z is one (one or more disagreements evident in the plurality of RAM arrays 120).

Now, the zero bit Z can be used to form a response bit pattern that is suitable for use by the conventional BIST circuitry 130. This function is the providence of the corrector circuitry 220.

The corrector circuitry 220 produces a response bit pattern that matches the probe bit pattern only if the comparator circuitry 210 produces the value of the zero bit is zero. To do so, the illustrated embodiment of the corrector circuitry 220 uses the bit read from the particular addressable location of the pseudo-memory 170, PDO, and the zero bit Z to construct the response bit pattern, CDO, as follows:

$$CDO[0] = PDO \vee Z$$

$$CDO[1:m-1] = DO_0[1:m-1]$$

The purpose of the pseudo-memory 170 now becomes clear. Since the contents of the pseudo-memory 170 are assumed to be correct, the value of PDO remains correct only if the value of Z is zero; otherwise, Z inverts and therefore corrupts the value of PDO.

The remainder of the response bit pattern CDO is constructed by selecting bits from the data-out bit pattern from the first RAM array DO$_0$. This choice is arbitrary but straightforward; any appropriate portion of any RAM array or combination thereof could be used instead.

Accordingly, if any error is evident in any RAM array at a particular address, the first bit of the response bit pattern will fail to match the probe bit pattern previously written to the RAM arrays. (Other bits in the response bit pattern may also fail to match if errors are present in the bits from the data-out bit pattern from the first RAM array DO$_0$, but those errors are superfluous to the error evident in the first bit.)

Continuing with the example briefly set forth above, were the probe test pattern provided to a particular addressable location of each RAM array to be "0101010101010101" and were one of the RAM arrays to corrupt some or all of the probe test pattern, Y[ ] would contain one or more ones, the value of Z would be one, CDO[0] would be inverted with respect to PDO, and (assuming DO[1:m−1] contains no errors) the corresponding response bit pattern CDO would be "1101010101010101." "1101010101010" compares unfavorably to "0101010101010101;" thus, the conventional BIST circuitry 130 would detect a malfunction in the memory space.

As is apparent in FIG. 2, the response bit pattern CDO is provided to the conventional BIST circuitry 130. The BIST circuitry interprets the response bit pattern in a conventional way. If the response bit pattern fails to match the probe bit pattern the conventional BIST circuitry 130 originally supplied (which would be the case were any error to occur with respect to any of the RAM arrays), the conventional BIST circuitry 130 would be assumed to respond by indicating an error and calling for further operation to be terminated or perhaps by marking the particular addressable location as unavailable for future use. The functioning of the conventional BIST circuitry 130 is not important to an understanding of the present invention, but is known to those skilled in the pertinent art.

Figure 3:
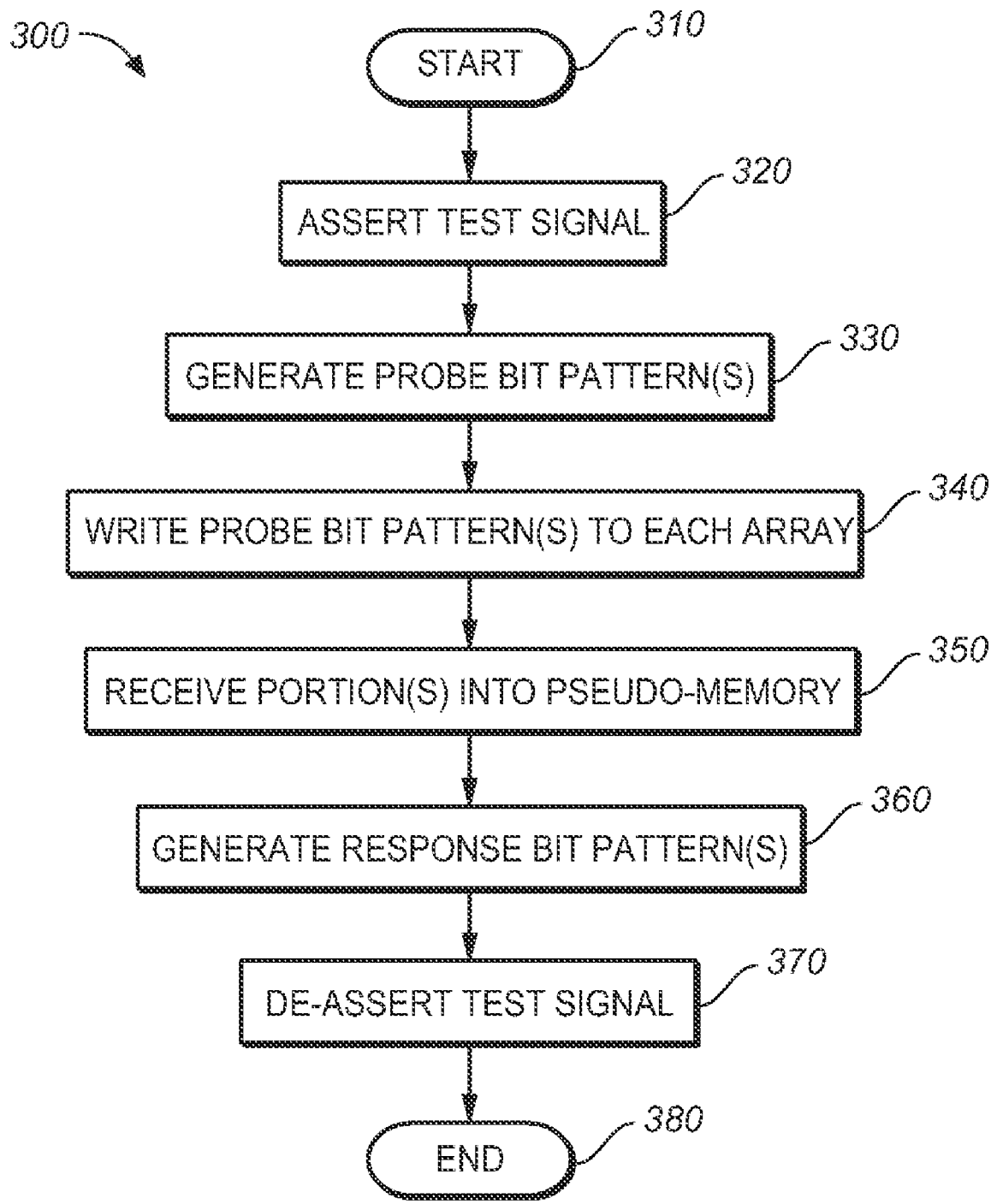
FIG. 3 illustrates a flow diagram of one embodiment of a method of allowing conventional memory test circuitry to test parallel memory arrays carried out according to the principles of the present invention.

Turning now to FIG. 3, illustrated is a flow diagram of one embodiment of a method, generally designated 300, of allowing conventional memory test circuitry to test parallel RAM arrays carried out according to the principles of the present invention.

The method 300 begins in a start step 310, in which it is desired to allow conventional memory test circuitry to test parallel RAM arrays. Conventional BIST circuitry asserts a test signal that is distributed to multiplexers in a step 320, causing the multiplexers to select signals emanating from bit pattern distribution circuitry in lieu of a processor. The conventional BIST circuitry then generates a probe bit pattern in a step 330.

The method 300 proceeds to a step 340 in which the probe bit pattern is caused to be written to each of the RAM arrays. Then, in a step 350, a portion of the probe bit pattern is received into a pseudo-memory. Next, in a step 360, the portion received into the pseudo-memory and data-out bit patterns read from the RAM arrays are employed to generate a response bit pattern that matches the probe bit pattern only if all of the data-out bit patterns match the probe bit pattern. At this point, the conventional BIST circuitry receives the response bit pattern in a step 370 and does with it what it will. Assuming that each response bit pattern matches each probe bit pattern, the conventional BIST circuitry deasserts the test signal in a step 380, releasing the RAM arrays for use by the processor.

Although the present invention has been described in detail, those skilled in the art should understand that they can make various changes, substitutions and alterations herein without departing from the spirit and scope of the invention in its broadest form.

What is claimed is:

1. A system for allowing conventional memory test circuitry to test parallel memory arrays, comprising:
    bit pattern distribution circuitry that causes a probe bit pattern generated by said memory test circuitry to be written to each of said memory arrays;
    a pseudo-memory, coupled to said bit pattern distribution circuitry, that receives and stores a portion of said probe bit pattern, thereby causing said portion to bypass said memory arrays; and
    combinatorial logic, coupled to said pseudo-memory, that employs said bypassed portion and data-out bit patterns read from said memory arrays to generate a response bit pattern that matches said probe bit pattern only if all of said data-out bit patterns match said probe bit pattern.

2. The system as recited in claim 1 wherein said bit pattern distribution circuitry comprises a multiplexer coupled to said each of said RAM arrays.

3. The system as recited in claim 1 wherein portion is a single bit.

4. The system as recited in claim 1 wherein said combinatorial logic comprises comparator circuitry that produces a zero bit only if all of said data-out bit patterns match said probe bit pattern.

5. The system as recited in claim 4 wherein said combinatorial logic further comprises corrector circuitry that produces said response bit pattern that matches said probe bit pattern only if said comparator circuitry produces said zero bit.

6. The system as recited in claim 1 wherein said response bit pattern differs from said probe bit pattern by a single bit if at least one of said data-out bit patterns fails to match said probe bit pattern.

7. The system as recited in claim 1 wherein a portion of said response bit pattern matches a corresponding portion of a data-out bit pattern from one of said memory arrays.

8. A method for allowing conventional memory test circuitry to test parallel memory arrays, comprising:
    causing a probe bit pattern generated by said memory test circuitry to be written to each of said memory arrays;
    bypassing said memory arrays by receiving and storing a portion of said bit pattern into a pseudo-memory; and
    employing said bypassed portion and data-out bit patterns read from said memory arrays to generate a response bit pattern that matches said probe bit pattern only if all of said data-out bit patterns match said probe bit pattern.

9. The method as recited in claim 8 wherein said causing comprises sending a signal to a multiplexer coupled to said each of said RAM arrays.

10. The method as recited in claim 8 wherein said portion is a single bit.

11. The method as recited in claim 8 wherein said employing comprises producing a zero bit only if all of said data-out bit patterns match said probe bit pattern.

12. The method as recited in claim 11 wherein said employing further comprises producing said response bit pattern that matches said probe bit pattern only if said zero bit is produced.

13. The method as recited in claim 8 wherein said response bit pattern differs from said probe bit pattern by a single bit if at least one of said data-out bit patterns fails to match said probe bit pattern.

14. The method as recited in claim 8 wherein a portion of said response bit pattern matches a corresponding portion of a data-out bit pattern from one of said memory arrays.

15. An integrated circuit, comprising:
    a processor;
    a plurality of identical memory arrays under control of said processor;
    conventional built-in test (BIST) circuitry;
    multiplexers, associated with said plurality of identical memory arrays and coupled to said processor and said conventional BIST circuitry, that allows said conventional BIST circuitry to take said control from said processor; and
    a system that allows said conventional BIST circuitry to test said plurality of identical memory arrays in parallel, including:
        bit pattern distribution circuitry that causes a probe bit pattern generated by said conventional BIST circuitry to be written to each of said plurality of memory arrays,
        a pseudo-memory, coupled to said probe bit pattern distribution circuitry, that receives and stores a portion of said probe bit pattern, thereby causing said portion to bypass said memory arrays, and
        combinatorial logic, coupled to said pseudo-memory, that employs said bypassed portion and data-out bit patterns read from said plurality of memory arrays to generate a response bit pattern that matches said probe bit pattern only if all of said data-out bit patterns match said probe bit pattern.

16. The integrated circuit as recited in claim 15 wherein said portion is a single bit.

17. The integrated circuit as recited in claim 15 wherein said combinatorial logic comprises comparator circuitry that produces a zero bit only if all of said data-out bit patterns match said probe bit pattern.

18. The integrated circuit as recited in claim 17 wherein said combinatorial logic further comprises corrector circuitry that produces said response bit pattern that matches said probe bit pattern only if said comparator circuitry produces said zero bit.

19. The integrated circuit as recited in claim 15 wherein said response bit pattern differs from said probe bit pattern by a single bit if at least one of said data-out bit patterns fails to match said probe bit pattern.

20. The integrated circuit as recited in claim 15 wherein a portion of said response bit pattern matches a corresponding portion of a data-out bit pattern from one of said memory arrays.

* * * * *